United States Patent
Lu et al.

(10) Patent No.: US 10,580,499 B2
(45) Date of Patent: Mar. 3, 2020

(54) READ ONLY MEMORY

(71) Applicant: UNITED MICROELECTRONICS CORP., Hsin-Chu (TW)

(72) Inventors: Hsin-Pang Lu, Hsinchu County (TW); Chi-Hsiu Hsu, Hsinchu County (TW); Chung-Hao Chen, Taoyuan (TW); Ya-Nan Mou, Hsinchu (TW); Chung-Cheng Tsai, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/710,851

(22) Filed: Sep. 21, 2017

(65) Prior Publication Data

US 2019/0043587 A1 Feb. 7, 2019

(30) Foreign Application Priority Data

Aug. 3, 2017 (CN) .......................... 2017 1 0654873

(51) Int. Cl.
| | | |
|---|---|---|
| G11C 16/24 | (2006.01) | |
| G11C 7/18 | (2006.01) | |
| H01L 27/112 | (2006.01) | |
| H01L 27/02 | (2006.01) | |
| G11C 17/12 | (2006.01) | |
| G06F 17/50 | (2006.01) | |
| G11C 7/02 | (2006.01) | |

(52) U.S. Cl.
CPC .......... *G11C 16/24* (2013.01); *G06F 17/5068* (2013.01); *G11C 7/02* (2013.01); *G11C 7/18* (2013.01); *G11C 17/126* (2013.01); *H01L 27/0207* (2013.01); *H01L 27/11226* (2013.01)

(58) Field of Classification Search
CPC ........ G11C 16/24; G11C 7/18; G06F 17/5068
USPC ........................................................ 365/104
See application file for complete search history.

(56) References Cited

U.S. PATENT DOCUMENTS

| | | | |
|---|---|---|---|
| 5,917,224 A | 6/1999 | Zangara | |
| 6,826,070 B2 | 11/2004 | Sung | |
| 6,853,572 B1 | 2/2005 | Sabharwal | |
| 8,422,262 B2 | 4/2013 | Nevers | |
| 2012/0195123 A1* | 8/2012 | Lee | G11C 16/3409 365/185.12 |
| 2013/0182509 A1* | 7/2013 | Lee | G11C 16/3459 365/185.22 |

* cited by examiner

*Primary Examiner* — Anthan Tran
(74) *Attorney, Agent, or Firm* — Winston Hsu

(57) ABSTRACT

A read only memory (ROM) is provided in the present invention, which includes a plurality of bit lines extending in a first direction, a plurality of source lines extending in parallel to the plurality of bit lines, and a plurality of word lines extending in a second direction perpendicular to the first direction. Each two ROM cells share an active area and are electrically coupled to one of the plurality of source lines by a common source line contact.

8 Claims, 1 Drawing Sheet

READ ONLY MEMORY

BACKGROUND OF THE INVENTION

1. Field of the Invention

The present invention relates generally to a read only memory (ROM), and more specifically, relates to a read only memory with each two ROM cells sharing a common source line and an active area.

2. Description of the Prior Art

Read-only memory (ROM) is a type of memory that persistently stores content or data. Typically, a ROM device comprises a memory arrangement having a plurality of bit-1 ROM cells and bit-0 ROM cells, where a bit-1 ROM cell is configured as storing a bit of data equal to 1 and a bit-0 ROM cell is configured as storing a bit of data equal to 0. To read a memory cell within a memory arrangement of a ROM device, a voltage is applied to the memory cell. If the memory cell is a bit-1 ROM cell, the memory cell produces a first response. If the memory cell is a bit-0 ROM cell, the memory cell produces a second response different than the first response. Thus, depending upon the response of the memory cell to the applied voltage, the memory cell is determined to be a bit-1 ROM cell or a bit-0 ROM cell, and thus as storing a 0 or a 1.

As electronic devices bus widths and bus speeds increase, the components that drive those buses must accommodate the accompanying current surges through the power (VDD) and ground (VSS) connections of the components. The current surge flowing through the impedance in component power connections, results in a voltage oscillation between the component power/ground reference level and the "system" power or ground voltage reference level. Some common names for this voltage oscillation include "Ground Bounce" "VDD Bounce", and "Simultaneous Switching Noise" (SSN). These bounces may upset the circuitry and/or cause it to not operate properly.

Ground bounce can occur with high-speed digital integrated circuits ("ICs") when multiple outputs change states simultaneously. Ground bounce can cause several undesired effects, both on the output of the switching device and on the receiving logic device. The switching output is supposed to provide a logical "1" or logical "0". Ground bounce can affect whether the switching output is properly read by receiving logic because the logical state is typically derived by comparing an incoming signal to the internal ground of the switching device. Noise on the signal and/or ground can alter the logical state read by the receiving logic and cause erroneous operation of the system if the ground bounce amplitude exceeds the instantaneous noise margin. For example, the ground bounce effect would make the reading operation of bit-0 data worse in ROM.

Further, the conventional ROM device is disadvantageous in that there is a crosstalk between adjacent bit lines, which negatively affects circuit operation. Accordingly, an additional circuit for compensating for crosstalk is necessary. The additional circuit may cause problems, such as layout area increase, power consumption increase and slow operating speed.

SUMMARY OF THE INVENTION

In order to overcome the above-mentioned ground bounce issue in read only memory (ROM), the present invention provides a novel read only memory, wherein each two ROM cells share a common source line that reserves only one ROM cell while one word line is turned on, so that the current surge may be effectively prevented. In addition, the source line may also provide a good ground shielding effect between adjacent bit lines.

In one aspect of the present invention, the preferred embodiment of the present invention provides a read only memory (ROM), which includes a plurality of bit lines extending in a first direction, a plurality of source lines extending in parallel to the plurality of bit lines, and a plurality of word lines extending in a second direction perpendicular to the first direction, wherein each two ROM cells share an active area and are electrically coupled to one of the plurality of source lines by a common source line contact.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
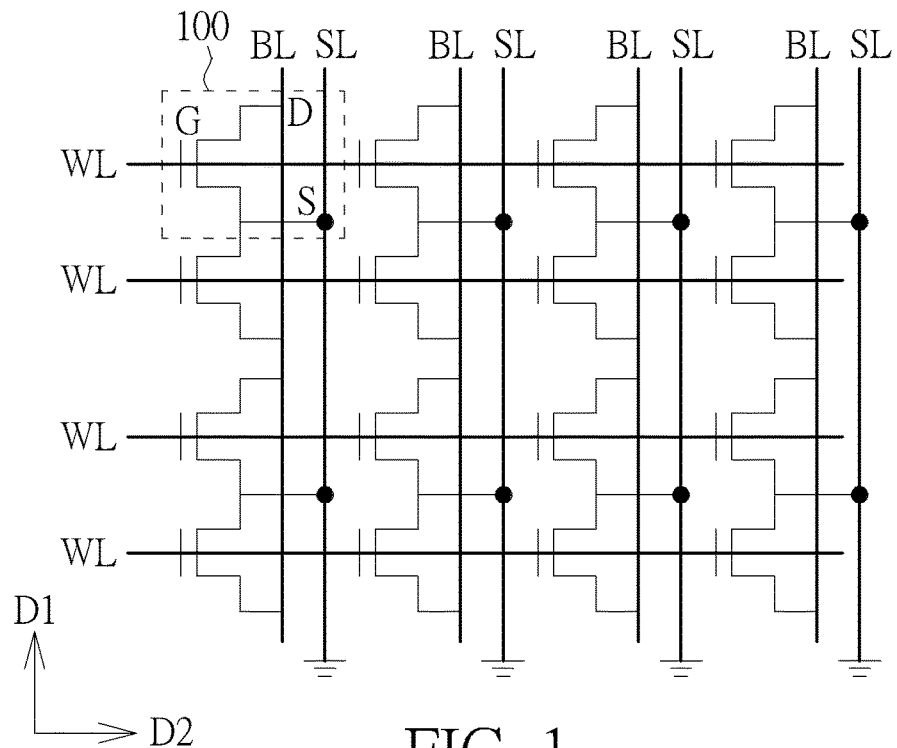
FIG. 1 schematically illustrates a circuit diagram of a read only memory (ROM) in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

FIG. 1 illustrates a circuit diagram of a read only memory (ROM) including an array of ROM cells in accordance with an exemplary embodiment of the present invention. The memory cell array includes a plurality of ROM cells 100. Each ROM cell 100 corresponds to a NMOS transistor programmed with data "0" or "1" respectively. Each two NMOS transistors have a common source S connected to a ground voltage by a source line SL, and each NMOS transistor has an individual drain D connected or not connected to a bit line BL and an individual gate G connected to a word line WL. The plurality of bit lines BL and source lines SL extend in a first direction D1 and the plurality of word lines WL extend in the second direction D2 perpendicular to the first direction D1. Furthermore, the bit lines BL and the source lines SL are arranged in an interlaced arrangement in the second direction D2. The ROM array associated with FIG. 1 may further include other components, such as a row decoder, a pre-charge circuit, a data transmission gate, column decoders and a data output circuit. All those components are conventional to those ordinarily skilled in the art and are not relevant to the present discussion. The description and drawing thereof will be herein omitted so as not to obscure the primary details of the invention and to provide the drawings with better clarity.

Data "0" of the ROM cell is encoded by connecting the drain D of the NMOS transistor to the bit line BL and data "1" of the ROM cell is encoded by not connecting the drain D of the NMOS transistor to the bit line BL. That is, data "0" is encoded in the ROM cell by forming a discharging path through the NMOS transistor and data "1" is encoded in the ROM cell by not forming the discharging path through the NMOS transistor. During a read operation, a pre-charge circuit (not shown) would pre-charge the bit lines BL to a logic "high" level. The word line WL is selected by a row decoder (not shown) and NMOS transistors connected to the word line WL are turned on. In the meanwhile, if the bit line BL is connected to the ground voltage by the source line SL, the current would flow from the bit line BL to the ground. As a result, the bit line BL would have a logic "low" level. If a bit line BL is not connected to the ground voltage, such as lacking the connection of via, charges will not be drawn to the source line SL, so that the bit line BL maintains a logic "high" level. The logic "low" level and "high" level of the bit lines BL would be received by a data output circuit (not shown) and be output and encoded as data "0" and data "1", respectively.

The ROM array of FIG. 1 has a scheme designed with adjacent NMOS transistors sharing a common source S and a common source line SL connected to a ground voltage. The ROM cell in this scheme employs only one ground voltage/source line unlike the conventional ROM cell in which two ground voltage lines are employed. Accordingly, a layout area of the ROM array of FIG. 1 may be smaller than that of conventional ROM array. Furthermore, each source line SL in this scheme would reserve for only one ROM cell while one word line WL turns on, unlike the conventional ROM device in which each source line reserve for all ROM cells connecting the word line while the word line turns on. Therefore, this scheme design effectively solves and prevents the ground bounce issue that current discharge surge flows through the impedance and make the reading operation of bit-0 data fail when multiple word lines change states simultaneously in ROM.

Figure 2:
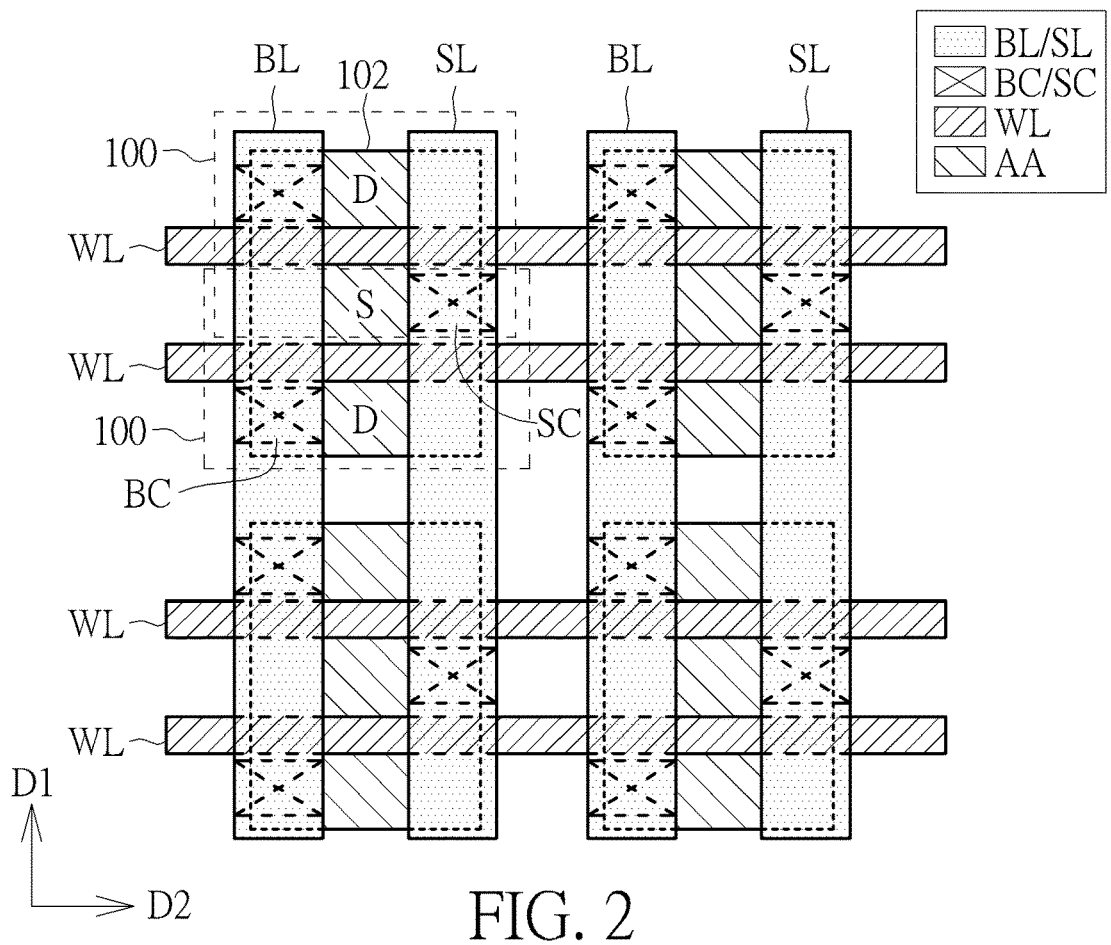
FIG. 2 illustrates a layout diagram of the read only memory shown in FIG. 1 in accordance with one embodiment of the present invention.

FIG. 2 illustrates a layout diagram of the read only memory (ROM) shown in FIG. 1 in accordance with the embodiment of the present invention. In FIG. 2, four exemplary rectangular active areas 102 are first formed in the substrate, wherein each active area 102 is designed to accommodate two ROM cells 100. That is, each two ROM cells 100 share an active area 102. Each active area 102 is traversed over by two word lines WL extending in the second direction D2 (row), wherein the region between the two word lines in each active area is defined as a common source S, and the regions at two outer sides of word lines WL are defined as two drains D respectively for the two ROM cells 100 in the active area 102.

Furthermore, each active area 102 is crossed over by a source line SL and a bit line BL extending in the first direction D1 (column) perpendicular to the second direction D2. The source line SL is electrically coupled to the common source S of the active area 102 by a source line contact SC, and the bit line BL may or may not be electrically coupled to the drains D of the active area 102 by bit line contacts BC, depending on whether the ROM cell is programmed with data "0" or "1". Each active area is provided with two bit line contacts BC at most respectively on two drains D at two outer sides of two word lines WL extending therethrough. One of the bit line contacts BC and the source line contact SC in the active area 102 are disposed at opposite sides of one word lines WL respectively. That is, the two word lines WL serve to turn on the gate of two NMOS transistors respectively in each active area 102.

In the manufacture, a dielectric layer (not shown) is formed first on the active area 102 and the word lines WL, and openings are then formed in the dielectric layer to expose the source S and drain D of the active area 102. By filling the openings with conductive metal, source line contact SC and bit line contact BC are formed within the openings. Source lines SL and bit lines BL are then formed in contact with the source line contact SC and bit line contacts BC respectively to achieve interconnection.

As shown in FIG. 2, the bit lines BL and the source lines SL are arranged in an interlaced arrangement across the active areas 102. In this scheme, the source lines SL may provide a good ground shielding between adjacent bit lines BL. The crosstalk issue between adjacent bit lines BL is therefore properly solved. In addition, the scheme of each two ROM cell 100 sharing one active area 102 may also provide a higher cell density in a limited ROM array area, since there will be lower number of spacings between the active areas of the columns of bit cells which is physically used to define the drains and channel of transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A read only memory (ROM), comprising:
a plurality of bit lines extending in a first direction;
a plurality of source lines extending in parallel to the plurality of bit lines;
a plurality of word lines extending in a second direction perpendicular to the first direction;
a plurality of active areas, wherein each of the active areas comprises exact two drains and exact one common source between the two drains; and
a plurality of ROM cells including first type ROM cells and second type ROM cells, wherein the first type ROM cell is bit-0 ROM cell encoded with data "0" and the second type ROM cell is bit-1 ROM cell encoded with data "1", and each of the ROM cells comprises exact one of the drains and exact one of the common sources, and exact two of the ROM cells share one of the active areas and one of the common source and are electrically coupled to one of the plurality of source lines by a common source line contact connecting to the common source, and the drains of the first type ROM cells are connected to the bit lines, while the drains of the second type ROM cells are not connected to the bit lines.

2. The read only memory of claim 1, wherein the plurality of bit lines and the plurality of source lines are in interlaced arrangement in the second direction.

3. The read only memory of claim 1, wherein each of the active area is crossed over by two of the plurality of word lines.

4. The read only memory of claim 1, wherein each of the active area is crossed over by one of the plurality of source lines.

5. The read only memory of claim 1, wherein each of the active area is crossed over by one of the plurality of bit lines.

6. The read only memory of claim 1, wherein each of the active area comprises two bit line contacts at most.

7. The read only memory of claim 6, wherein one of the bit line contact and one of the source line contact in the active area are disposed at opposite sides of one of the word lines respectively.

8. The read only memory of claim 1, wherein exact two of the ROM cells are electrically coupled to one of the plurality of bit lines by two bit line contacts connecting to two of the drains respectively, and the active areas in each row of the ROM cells are traversed over by two of the word lines and the active areas in each column of the ROM cells are traversed over by one of the bit lines and one of the source lines, wherein each of the active areas defines a smallest divisible area for performing data reading of the exact two of the ROM cells through selective outputs of the bit line using the common source line contact connecting to the common source.

* * * * *